United States Patent [19]

Beerwerth et al.

[11] 4,018,373
[45] Apr. 19, 1977

[54] DEVICE FOR BONDING ELECTRODES TO SEMICONDUCTOR DEVICES

[75] Inventors: Wolfgang Beerwerth, Neheim-Husten; Albrecht Geppert, Warstein; Horst Gesing; Rigobert Schimmer, both of Belecke, all of Germany

[73] Assignee: Licentia Patent:Verwaltungs-G.m.b.H., Frankfurt am Main, Germany

[22] Filed: Oct. 31, 1975

[21] Appl. No.: 627,781

Related U.S. Application Data

[62] Division of Ser. No. 484,629, June 28, 1974, Pat. No. 3,965,567.

[30] Foreign Application Priority Data

June 28, 1973 Germany .......................... 2332822

[52] U.S. Cl. ............................ 228/44.1 A; 29/587; 29/589
[51] Int. Cl.² ....................................... H01L 21/603
[58] Field of Search ............... 228/6 A, 5.5, 44.1 A, 228/123, 180 A; 29/203 J, 203 P, 203 S, 587, 589; 269/37, 40, 43, 45

[56] References Cited

UNITED STATES PATENTS

| | | | |
|---|---|---|---|
| 3,064,715 | 11/1962 | Bland | 269/267 X |
| 3,317,106 | 5/1967 | Dix | 228/44.1 A |
| 3,369,290 | 2/1968 | Mayer et al. | 228/123 X |
| 3,669,333 | 6/1972 | Coucoulas | 228/106 X |
| 3,887,998 | 6/1975 | Hartleroad et al. | 228/6 A X |

*Primary Examiner*—Al Lawrence Smith
*Assistant Examiner*—K. J. Ramsey
*Attorney, Agent, or Firm*—Spencer & Kaye

[57] ABSTRACT

An electrode centering and clamping device for producing diffused, contacted and surface passivated semiconductor chips for semiconductor devices, wherein after producing a semiconductor wafer with a given arrangement of layers and regions of different conductance and different conductivity types for a plurality of devices by doping with impurity forming elements, both of the major surfaces of the semiconductor wafer are provided with respective metal layers and output electrodes are applied to both of the metal layers for the plurality of devices with the output electrodes being of such a thickness and overlying such areas of the metal layers so that the thickness of the electrodes will still be sufficient for further processing after a subsequent separation of the wafer into the plurality of chips and the major surfaces of the chips after separation, are completely covered by the output electrodes. The semiconductor wafer is then separated into the intended plurality of individual chips which are then provided, if required, with a contour which reduces the field intensity. The individual chips are then etched, measured, and if required repeatedly etched and measured and, if found satisfactory, are provided with a protective layer on the exposed semiconductor surfaces.

5 Claims, 9 Drawing Figures

DEVICE FOR BONDING ELECTRODES TO SEMICONDUCTOR DEVICES

CROSS REFERENCE TO RELATED APPLICATION

This application is a division of application Ser. No. 484,629, filed June 28th, 1974, now U.S. Pat. No. 3,965,567.

BACKGROUND OF THE INVENTION

The present invention relates to a method for producing diffused, contacted and surface passivated semiconductor wafers for semiconductor devices. Semiconductor wafers in this stage of production, which hereinafter will be briefly called "unit cells", are thereafter installed, if and when required, in a housing, a thick film circuit or a printed circuit.

According to known manufacturing processes, semiconductor devices, such as diodes, transistors, thyristors or triacs, for example, are produced by changing the electrical characteristics of the surface of homogeneously doped semiconductor wafers, either wholly or in part, by the introduction of further impurity forming elements, using alloying and/or diffusion processes, to a given depth so that an arrangement of layers and regions of different conductance and different conductivity types is created.

For economic reasons it is advisable not to produce small devices individually but rather to perform the doping and metallization on relatively large wafers which are then divided into individual devices, for example, by etching, sawing, sandblasting or scoring and breaking. These individual devices are finally connected with the current conducting leads by pressure, solder, welded or glued contacts, in the usual manner. In order to protect the semiconductor surfaces against damage and the influence of the ambient atmosphere, the semiconductor wafers are then installed in hermetically sealed housings which, if required, are filled with an inert gas, or are cast or pressed into an insulating material, for example, epoxy resin or silicone resin.

It is a characteristic feature of these known processes in which a plurality of small individual elements are produced from one large silicon wafer, that for complicated structures the metal contact layer must be applied via a masking step. This contact layer must resist the attacks of the separating and etching steps, which limits the selection of contacting metals that can be used, often to the detriment of the subsequent connecting steps.

Devices produced in this manner are distinguished by high sensitivity which requires an uninterrupted flow of process steps including, in particular, the subsequent encasing in a housing or embedding in a protective insulating material. This constitutes a drawback since the separation into quality classes and elimination of rejects can usually be effected only with finished devices which are installed in a final housing.

Semifinished devices are known, such as glass passivated thyristors and triacs which are provided with solder, for example, or devices which are produced according to the planar technique. For these structural types the yield of devices which block at about 1000 V and which are thus particularly desired in a production process directed toward highly blocking devices is poor. Moreover, these devices cannot be fully measured and tested, for example, they cannot be tested under high currents, because no suitable contacts have as yet been applied. Under such test conditions it is impossible to make a final determination of all the characteristics or parameters of the device which are to be expected particularly concerning the current carrying capability, and which will result only after insertion of the device in a housing. It has been found that in the presently employed processes the characteristics determined after installation in a housing often differ from the desired values and from the values previously measured on the individual devices prior to installation.

Aside from the fact that the known embodiments cannot be fully measured and tested before installation in a housing in order to determine a lack of desired characteristics, there hardly exists a possibility, after installation in a housing, to then eliminate a noted lack of sufficient parameters by subsequent correction, for example, by renewed etching of the semiconductor wafers. Often the gold layer which is advisable for good solderability and etchability substantially worsens the properties of the soft solders used for the connections. Since there is thus practically no favorable way to subsequently improve the characteristics of the devices, the proportion of inferior devices and rejects in the total production is correspondingly relatively high in the known processes.

A further drawback of the known processes is that storage, which for the above reasons will usually be limited only to the finished devices, is rather expensive. Moreover, the storage facility is poorly adaptable to a changing requirement for devices of different sizes unless the adaptation is achieved exclusively by a mere increase in the size of the storage facility which again would be uneconomical.

Finally, the high sensitivity of the known embodiments of semiconductor wafers must be considered to be a disadvantage. Since the semiconductor body, for example, the silicon body, is not or only insufficiently protected against mechanical damages, the transport of the devices presents a problem. Thus the selection of a more favorable location for further processing is either limited or impossible. Moreover, the devices are poorly suited for process or testing steps in a production sequence which involves highly mechanized or automatic production methods.

SUMMARY OF THE INVENTION

It is the object of the present invention to provide a method for producing diffused and surface passivated semifinished semiconductor wafers in which a plurality of individual devices (the so-called unit cells) produced from one large silicon wafer, preferably highly blocking semiconductor devices, i.e. those which block around or above 1000 V, are produced from one large silicon wafer, and in which the devices even under high currents, can be measured as to the parameters of their electrical properties before installation in a housing. The devices should be so insensitive mechanically that they can be transported in bulk without adverse influence on their properties and can be further processed and fully measured, particularly in a mechanized or automatic manufacturing process. The unit cells are to be capable of being used in different housings, if required, and should be easily adaptable to the requirement for various types so that storage is also simplified. Moreover, the unit cells are to be suited for automatic intermediate measurements and a possibly required subsequent etching to improve the electrical parameters before the passivation is applied so that the proportion of resulting high quality devices is improved as compared to those realized in the known manufacturing processes. For particularly high blocking voltages they are to be capable of being subjected to a mechanical surface shaping and no other, only additional process steps should be required for this purpose. The quantity of silicon surface required for the mechanical process is to be a minimum.

This is accomplished by the present invention in a method for producing diffused, contacted and surface passivated semiconductor chips for semiconductor devices in that initially a given arrangement of layers and regions of differing conductance and different conductivity types for a plurality of devices is produced, in a known manner and after the application of a mask, if required, in a semiconductor wafer by doping with impurity forming elements, that then both major surfaces of the semiconductor wafer are provided with respective metal layers on both of which output electrodes for the plurality of devices corresponding to the available arrangement of layers and regions of different conductance and different conductivity types are applied with such a thickness and overlying such an area of the metal layers that the thickness of the electrodes is sufficient for further processing even after a subsequent separation of the wafer into the individual chips and the major surfaces of the individual chips are completely covered by the output electrodes after separation. The semiconductor wafer is then divided into the intended plurality of individual contacted chips, the individual contacted chips are etched, are measured to determine their operating characteristics, and if required, are re-etched and remeasured and, if found acceptable, are provided with a protective layer on their free semiconductor surfaces.

If the devices being produced are of the type which require contouring of the edge surfaces of the semiconductor chips in order to reduce the field intensity at the pn junctions extending to the edge surfaces, this contouring is carried out after separation of the wafer into the individual chips but before the etching thereof.

The unit cells produced according to the method of the present invention can be fully measured even under high currents — compared to the contact area — immediately after they have been separated into individual elements, due to their large area and relatively thick output electrodes, without it being necessary to install them in a housing and to further contact them. They can thus be easily sorted into quality classes. Unsuitable devices can be rejected without the additional material and labor expense required to place same in a housing. On the other hand, there also exists the possibility of improving the characteristic parameters of such devices which initially do not meet the set requirements by repeated etching and thus reduce the proportion of rejects.

The method according to the present invention further provides the possibility of effecting the separation of the large semiconductor wafer into the individual or contacted chips without additional masking because the output electrodes simultaneously serve as masks during the separating process which is advisably effected by etching or sand-blasting.

After separation into the individual elements the electrodes protect the semiconductor body against mechanical damage. The individual elements can thus be transported in bulk even in this processing stage without any special precautionary measures being required and are thus suited for mechanized or automatic further processing.

It is advisable to apply the metal layers with which both major surfaces of the semiconductor wafer are provided before the wafer is separated into individual elements over the entire surface areas because in this way an otherwise required additional masking step can be eliminated. Nickel has been found to be a suitable metal which is applied by vapor-deposition or by electroless deposition. However, other soft solderable metal layers are also suited for this purpose.

In view of the subsequent process steps of soldering, separating and etching, it is advantageous to select a material for the output electrodes which can be soft soldered without requiring additional coatings and which is simultaneously sufficiently resistent against the etching chemicals. Silver or nickel or a silver/nickel alloy which meets these requirements have been found particularly favorable for use as the contact material. However, other known metals, which are provided with soft solderable and etch resistant layers, are also suitable. Such other known metals are, for example, tungsten, molybdenum and aluminum and A a cobalt, iron alloy with the following exemplary compositions which is sold under the trademark Vacon:

28% nickel, 18% cobalt, 54% iron;
28% nickel, 21% cobalt, 51% iron;
28% nickel, 23% cobalt, 49% iron.

The owner of the trademark is Vacuumschmelze Aktiengesellschaft, 645 Hanau, Gruner Weg 37, West Germany.

It is further advisable to apply the soft solder used to solder the contacts onto the semiconductor wafer, for example, a sufficiently etch-resistant soft solder with a high proportion of lead, such as Pb 90, Ag 5, In 5, on one side of the electrode material over a large area before the soldering process, for example, by rolling or melting the solder — and to produce the required electrode shapes, for example, circular discs or rings, by stamping from the thus coated material. In a favorable manner shaped bodies of conductive material, which has a higher melting point than the solder, are additionally contained in the solder as spacers and prevent the flowing out of the molten solder during the soldering process and limit the wetting to the area below the electrodes. Since during the stamping out of the electrodes, a stamping depression is produced on one surface of the electrode and a grade or slope on the other surface, the stamping direction during the cutting of the electrode material is selected so that the stamping impression occurs on the surface of the electrode material which has the solder layer. This measure also prevents undesirable flowing out of the solder during the melting process.

According to the preferred embodiment of the invention the output electrodes have the same or a greater thickness than that of the semiconductor wafer. If, for example, a silicon wafer with a layer thickness of about 0.3 mm is selected for the semiconductor wafer, the output electrodes will have layer thicknessess of about 0.3 to 0.6 mm. and preferably 0.5 mm.

It is a further advantage when producing controlled rectifiers according to the invention to select the layer thickness of the gate electrode to be greater than that of the other electrodes because this facilitates the further assembly steps. Advisably the layer thickness of the gate electrode, which is designed, for example as a cylinder or as a sphere covered with solder, is about 0.5 mm greater than the thickness of the other electrodes.

Of course, it is to be understood that the electrode for the control electrode can also be eliminated and the control region can be designed to be controlled by an optical signal, for example, by means of a light conductor or a laser diode. An electrode which encloses the control area in the form of a ring offers particularly favorable conditions for such application.

Finally it is also advantageous to provide contacts on the major surfaces of the semiconductor wafer which lie opposite one another, for example, anode and cathode contacts, with different diameters, and with the contact having the smaller diameter being the one which is on the surface of the semiconductor wafer toward which the separating medium, e.g. a sand blast or an etching fluid, is directed. When this arrangement is employed during the separating of the semiconductor wafer into individual chips, the advantage is achieved that after separation the semiconductor material will not extend beyond the edges of the output electrodes.

The difference in size of the electrodes opposing one another on the semiconductor wafer depends, inter alia, on the thickness of the semiconductor wafer. With a wafer thickness of 0.3 mm the difference between the diameters of the two output electrodes should be about 0.3 mm. Thus with an anode diameter of for example 3.5 mm, the cathode diameter should lie at about 3.8 mm.

For asymmetrically blocking devices the correct selection of the surface area of the electrodes permits a preferred edge angle for the semiconductor chip to be produced with the aid of etching or sand blasting. With devices which block in both directions, the separating conditions for the wafer are favorably selected so that the edge of the semiconductor wafer is as perpendicular as possible to the surfaces of the contact electrodes.

If requirements exist for particularly high blocking voltages or if the requirements for dependability at lower voltages are extremely high, mechanical surface treatment which reduces the field intensity at the edge surfaces of the semiconductor chips will be necessary. The unit cell according to the present invention is particularly suitable for such purpose. The two comparatively thick electrodes with precise dimensions permit good insertion into the processing devices. The spacers which are additionally preferably contained in the solder take care that a reproduceable, uniform soldering gap is produced which also facilitates processing.

DETAILED DESCRIPTION OF THE PREFERRED EMBODIMENTS

Figure 1:
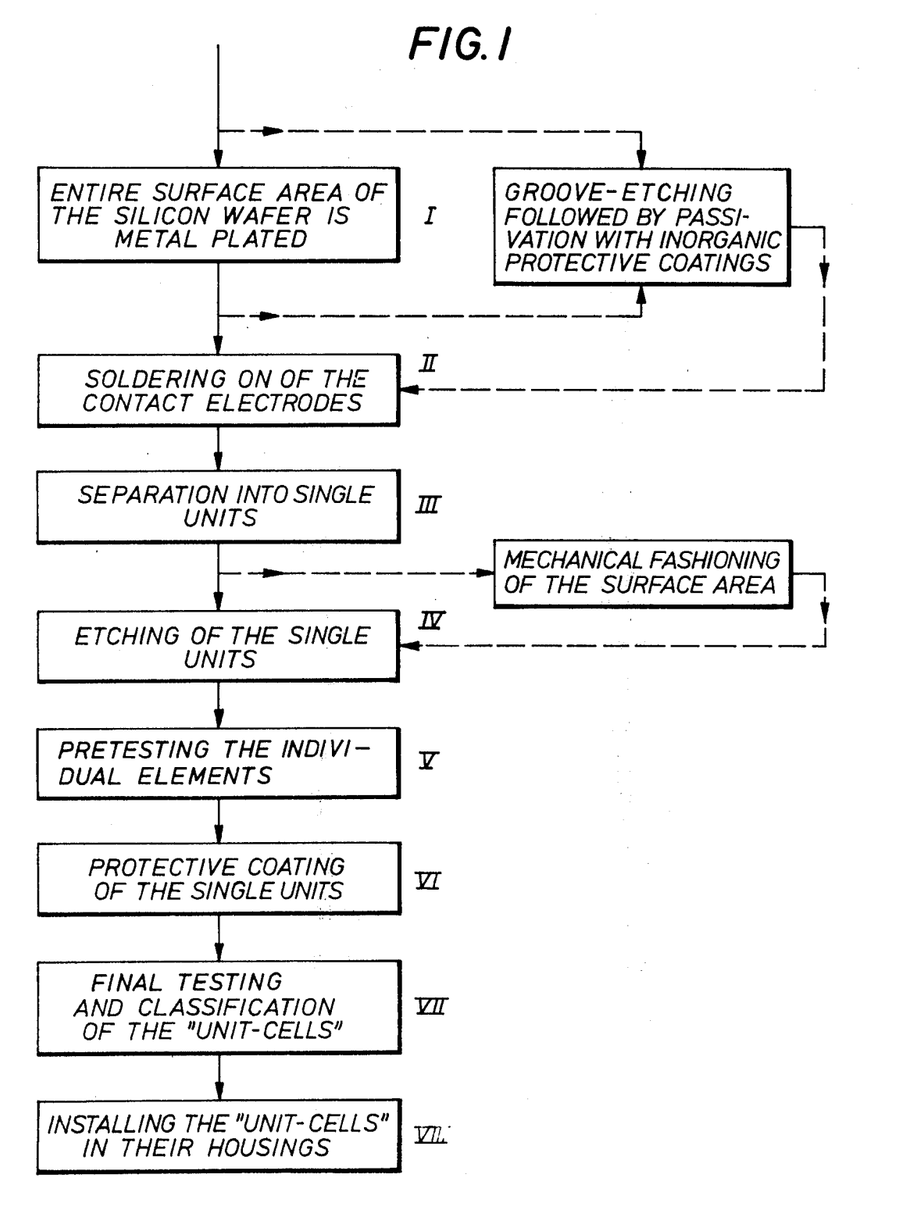
FIG. 1 is a flow diagram for the method according to the invention.

The method according to the present invention will be described in detail for the production of a thyristor with round outer shape and a control contact in the center of one of its major surfaces. It is to be understood, however, that the individual process steps can also be used for the production of other semiconductor devices. A basic sequence of the individual process steps according to the invention is shown in FIG. 1.

Figure 2:
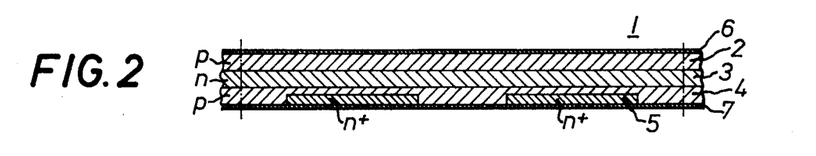
FIGS. 2 and 3 are schematic illustrations of a semiconductor wafer after initial metallization and contacting respectively according to the method of the invention.

As shown in FIG. 2, in the selected example, which is the production of thyristors which are preferably designed for average blocking voltages, the basic starting material is a large semiconductor wafer 1, for example, a silicon wafer, of n-type conductivity in which initially layers and regions of different conductance and different conductivity type are produced according to methods known in the semiconductor art. The resulting layer sequence is then, in the illustrated example, a p-type conductivity layer 2, an n-type conductivity layer 3 and a p-type conductivity type layer 4, with $n+$ type conductivity regions 5, which are annular in the illustrated example, being present in the $p$ conductive layer 4. According to the intended arrangement and size of the individual elements, the arrangement and structure of the above-mentioned regions 5 are repeated at uniform intervals along the surface of layer 4. Metal layers 6 and 7, for example, of nickel, are then applied (Block I of FIG. 1) on both major surfaces of the thus prepared wafer 1, either in annular or circular partial regions corresponding to the desired location of the output or contact electrode, or preferably over the entire surface areas since such a continuous layer will eliminate the masking step required to form shaped layers.

Figure 3:
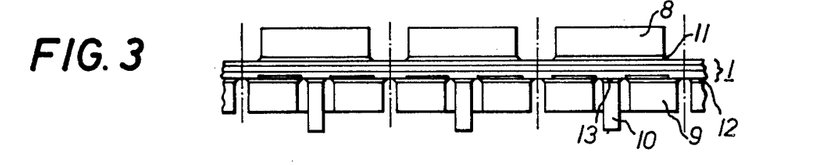

Thereafter as shown in FIG. 3, output electrodes 8, 9, 10, for example of silver, nickel or a silver/nickel alloy for the anode, cathode and gate contacts, respectively, are then soldered onto the metal layers 6 and 7 with the aid of etch-resistant soft solder layers 11, 12 and 13, respectively, with the spacing between the largest electrodes being about 0.3 mm. This step is indicated by Block II of FIG. 1.

The output electrodes 8 and 9, according to the invention, have a diameter corresponding to the desired diameter of the individual chips after separation of the wafer 1, with one of the electrodes 8 and 9 (in the illustrated example, the electrode 8) having a smaller diameter than the opposed electrode 9. During the subsequent separation process, the separating medium is directed against the surface of wafer 1 containing the electrode 8 whereby the edge surface of the wafer will have a slope extending between the two electrodes.

Figure 9:
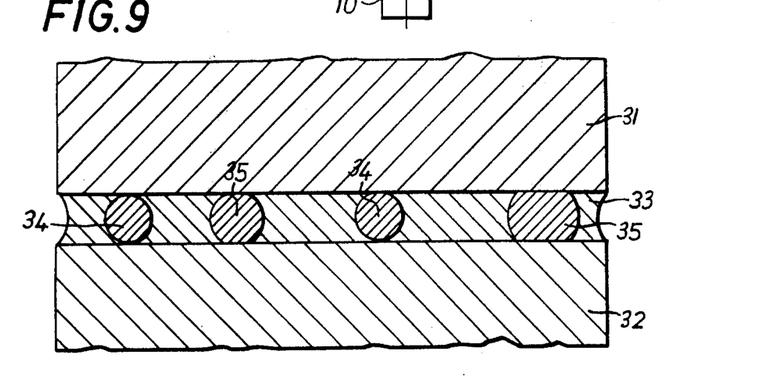
FIG. 9 is a cross-sectional view showing a solder connection, or joint, formed in accordance with the present invention.

As shown in FIG. 9, additives are incorporated into the solder which is to form the layer, the solder with the incorporated additives is subjected to conditions which cause it to form a layer, and the additives are given dimensions such that, during the formation of the layer, the distance between the two parallel surfaces contacting the additives corresponds to the desired solder layer thickness, the additives being such that any change in their dimensions will only be within predetermined limits under the established soldering conditions.

For the incorporation, or mixing in, of the additives, it is possible to first melt the solder and then to mix the melted solder with additives, mechanical mixing and rapid cooling taking care that the additives are uniformly dispersed throughout the hardening melt. It is also possible, however, to add the additives to the solder while both are in their solid states, as for example by applying the additives to a soldering foil and then rolling the same in, or mixing the additives with pulverized solder or pulverized solder components and thereafter sintering or melting together the parts.

For the sintering operation the powered alloy, e. g. 60% lead, 40% tin, is mixed at room temperature with the additive bodies and then sintered together in a producer gas of 80% nitrogen and 20% hydrogen at 175° C and atmospheric pressure or higher pressure.

The achievement and maintenance of a uniform distribution of the additives in the solder is facilitated if the density of the additives is equal, or comparable, to the density of the solder. Thus, it has been found to be satisfactory to add to a soft solder made of an alloy containing 90% lead, 5% indium and 5% silver and having a density of about 11 g/cm$^3$, additives made of an alloy containing 90% silver and 10% gold and having a comparable density.

The desired solder layer thickness is realized either in that the additives are initially given the same dimensions, with the same tolerances, as the desired resulting solder layer thickness, or in that the dimensions of the additives are equal to and/or greater than the desired solder layer thickness and the material is shaped, subsequently but prior to the soldering process, to the desired solder layer thickness. Such shaping can be effected, for example, by rolling.

One or a plurality of metals or metal alloys whose melting points are higher than the melting point of the solder employed are suitable as additives. If the solder layer thickness is set to a smaller value by rolling of possibly larger additives, the metals or metal alloys must also be rollable.

From the large number of metals or metal alloys which seem to be suitable for the additive bodies used in the process according to the present invention, copper or nickel-plated copper, gold-silver alloys or nickel-plated gold-silver alloys with an approximate proportion of 10% gold and 90% silver, nickel-plated silver, or nickel have been found to be particularly well suited.

Possibly, hard solders can also be used instead of soft solders.

Advisably the additives will be in the form of spheres or cylinders.

FIG. 9 is a sectional view of an exemplary solder connection made according to the process of the present invention. Between two parts 31 and 32 to be connected together there is placed a shaped piece of solder 33 which has been obtained in the above-described manner from a solder foil. Spherical bodies 34 are contained in the solder 33 as additives, their diameter corresponding to the intended solder layer thickness. Additionally, or alternatively, the solder contains bodies 35 formed of spheres initially having a diameter larger than the intended solder layer thickness and then brought to the intended layer thickness by rolling.

After heating to the melting temperature of the solder and after liquefication of the solder, the spacing between the facing surfaces of parts 31 and 32 is maintained by bodies 34 and/or 35. Thus even after cooling and resolidification of the solder this space will accurately correspond to the intended solder layer thickness.

Figure 4:
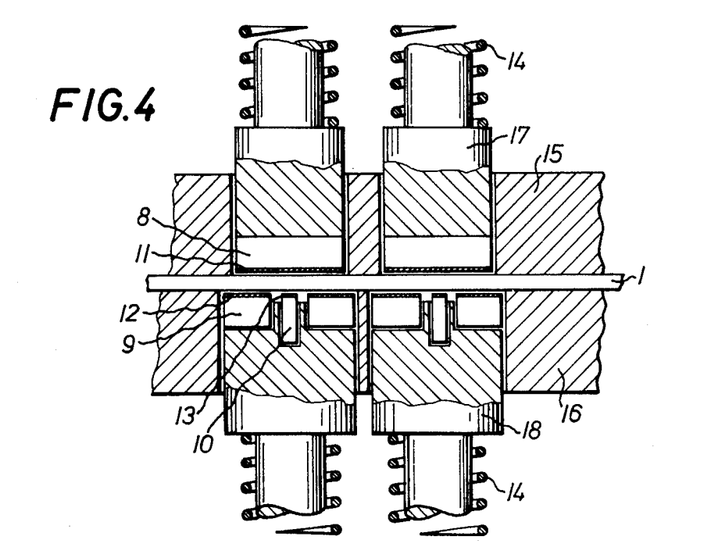
FIG. 4 is a schematic elevational view of an apparatus for simultaneously applying the contact electrodes according to a further feature of the invention.

According to a further feature of the present invention, the electrodes 8, 9 and 10 are soldered onto the metal layers in a novel soldering device or jig by means of which a plurality of electrodes may be simultaneously soldered to both sides of the semiconductor wafer. This soldering jig which is schematically shown in FIG. 4, includes a pair of opposed parallel plates 15, 16 between which the semiconductor wafer 1 is clamped or held in a desired manner. The plates 15 and 16 are each provided with a plurality of bores which fix the postion and spacing of the individual output electrodes on the semiconductor wafer 1. The diameter of each of the bores is adapted to the diameter of the respective anode, cathode or gate electrode, with the spacing of the bores from one another corresponding to the spacing of the arrangement of individual devices intended to be produced in the semiconductor wafer and determined by the preceding doping steps, which devices are to be separated from the larger semiconductor wafer in later process steps.

The output electrodes are placed in the bores in such a manner that the end surfaces of electrodes 8, 9, 10 which bear the solder layers 11, 12, 13 face the metal layers 6 or 7. During the soldering process the electrodes 8, 9, 10 are pressed onto the semiconductor wafer by means of springs 14 which act on bolts or rods 17, 18 so that simultaneous soldering of the electrodes 8, 9, 10 onto both sides of the silicon wafer becomes possible. In the illustrated example, the end surface of bolt 18 is designed so that it has a recess which receives and holds the gate electrode 10 and centers it.

Suitable materials for the springs 14 are heat-resistant steels, tungsten and molybdenum. The centering plates 15 and 16 are preferably made of a material which is neither wetted by the solder nor has a coefficient of thermal expansion which differs much from that of the semiconductor material, since otherwise the required precise coincidence of the diffusion pattern and the output electrodes is not assured and furthermore, the removal of the semiconductor wafer provided with the output electrodes from the soldering device would be more difficult and the semiconductor wafer could be damaged. Molybdenum has been found to be particularly suitable for the material for the centering plates and assures safe removal of the semiconductor wafers.

For devices which must meet high requirements for resistance to alternating temperature loads, the connections between the output electrodes and the semiconductor wafer can advantageously be made, instead of by means of the above-described soldering method, by means of alloying methods. In this case an electrode material is used which has a coefficient of expansion which is similar to that of the semiconductor material and which is alloyable with the semiconductor material via an intermediate layer. It has been found satisfactory to apply intermediate layers of aluminum, possibly by means of vapor-deposition, to a silicon semiconductor wafer and to alloy electrodes, preferably of tungsten, onto the surfaces. The contact pressure during alloying is produced either by spring pressure, as described above, when both sides are contacted simultaneously or by appropriate weights when both sides are contacted separately.

Figure 5:
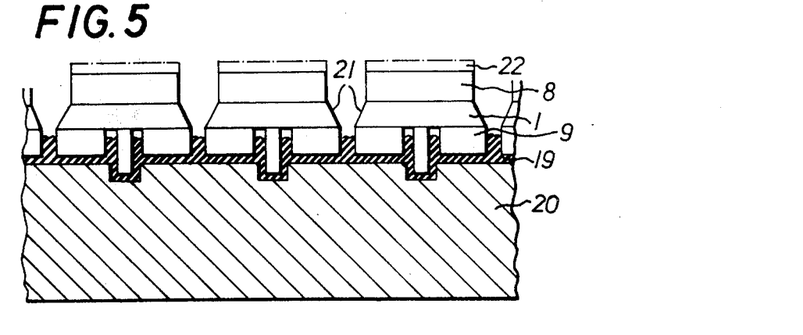
FIG. 5 is a schematic view showing the semiconductor wafer after separation into individual contacted chips according to the method of the invention.

After soldering or alloying of the output electrodes, the semiconductor wafer is divided (Block III of FIG. 1) into individual devices by sand blasting and/or with the aid of etching solutions. For this purpose the semiconductor wafer is attached — as shown in FIG. 5 — to a carrier plate 20, for example, a stainless steel plate, with an etch-resistant adhesive lacquer 19. It is here advisable to attach the surface of the wafer bearing the gate electrode 10 to the plate 20 since otherwise additional protection against the separating medium for the noncontacted silicon in the region between the gate and cathode electrodes would be necessary. If the separation is effected by sand blasting, the dry method as well as the wet method can be used. However, the wet sand blasting method offers the advantage that the semiconductor surface is less attacked and destroyed and that the subsequent etching treatment can be shortened. It is also favorable to initially remove the portions of the metal layers between the electrodes and any possibly protruding solder from the semiconductor device in a sand blasting process and then divide the semiconductor body by sand blasting and/or etching.

With the output electrodes dimensioned as indicated above, in a particularly advantageous manner, the output electrodes serve as masks during the separating process, which masks protect the surfaces of the semiconductor material 1 and restrict the attack to the points 21 to be severed. In this case, no additional masking is necessary. Since, however, a portion of the surface of the output electrodes is also removed during the separating process, the thickness of the output electrodes which are exposed to the separating medium — the sand blast, for example — is selected to be somewhat larger than is necessary in the final device at the time the electrodes are initially applied. Thus FIG. 5 shows the output electrode 8 (which is the electrode subjected to the separating medium) as being larger or thicker by a layer thickness 22 than the output electrode 9. During wet sand blasting and when nickel or silver are used as the output electrodes, the amount of electrode material removed is about 0.1 to 0.2 mm. In this case a layer thickness of 0.6 to 0.7 mm is thus initially selected for electrode 8 which is exposed to the sand blast, if a layer thickness of 0.5 mm is assumed for the other electrode 9. Insofar as the electrode material is not itself etch-resistant and was provided with an etch-resistant layer as a protection against etching attack, then it will be necessary to provide an additional covering to the electrode during the sand blasting.

Figure 6:
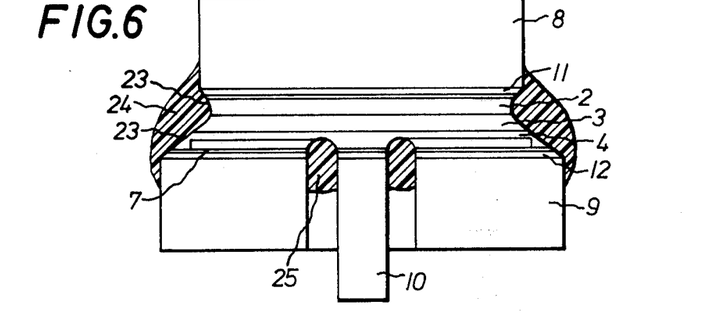
FIG. 6 is a schematic view showing one example of a completed chip according to the method of the invention.

After the semiconductor wafer 1 has been divided into the intended number of individual contacted chips, the individual chips are etched while still attached to plate 20, unless an additional shaping is intended, in order to free the semiconductor surface from impurities and to remove crystal defects at the surface. After the etching, the contact chips are removed from the support plates 20 and the metal layer 7 between cathode contact 9 and gate contact 10 is removed by renewed etching unless this removal has already been effected by the sand blasting operation. The resulting shape of metal layer 7 is shown in FIG. 6.

In this stage of manufacture the contacted chips are completely measurable and testable as regards their electrical properties or operating characteristics and can be sorted into quality classes or can be subjected to renewed etching, if required, i.e. if the measured parameters do not yet meet the desired requirements for the devices being produced. With this subsequent etching it is possible in many cases to sufficiently improve the parameters of the contacted chips, and to thus considerably reduce the proportion of rejects. The contacted chips are also mechanically so resistant that measurements and testing as well as further processing steps can be preformed in mechanized or automatic processes without the devices being damaged.

During measuring and in the further processing steps of the individual chips it is favorable, in order to avoid damage to the semiconductor surface for the semiconductor bodies to not protrude beyond the edge of the output electrodes 8 and/or 9 after the severing or separating process. This is accomplished in that the diameter of the output electrode 8 which is subjected to the influence of the sand blast is selected to be smaller than the diameter of output electrode 9. The lateral edge of semiconductor wafer 1 is also subjected to the influence of the sand blast when the size relationships for the diameters of the electrodes 8 and 9 are as just described. Thus a portion of the semiconductor wafer 1 which protrudes beyond the output electrode will also be removed during the separating process, or the lateral edge of the semiconductor wafer 1 will even receive a slope 23 as shown in FIG. 6. With this slope an edge angle is obtained which already favorably influences the blocking capability of the semiconductor device in a desired direction as is required and in a degree which is sufficient, for example, for transistors and diodes.

In devices which are to be blocking in both directions, such as, for example, thyristors, a further process step which, as described in the embodiment for average blocking voltages, is a combination of separating and etching processes must be employed to produce a fillet in the edge of the semiconductor chip or alternatively this fillet is produced by an additional mechanical treatment process before the etching. This later process is advisable in particular for devices with a very high blocking capability.

The contacted chips are then tested (Block V of FIG. 1) and those cells with satisfactory parameters are then provided with protective layers 24 and 25 (Block VI of FIG. 1) in the edge regions of the chips where the pn-junctions come to the surface and in the region between the cathode electrode 9 and gate electrode 10, respectively. Lacquers and rubber type substances known in the semiconductor art are suitable for the protective layers 24 and 25. Additionally, glass layers or other inorganic compounds, such as silicon oxide, silicon nitride or mullite, can be used for this purpose.

A further possibility for passivating with glass or other inorganic compounds exists in that, as indicated in FIG. 1, prior to the attachment of the output electrodes, trenches are made in the semiconductor wafer, either before or after the application of the metal contact layers 6 and 7, and the trenches are then provided with the passivation materials. When used with such devices, containing trenches, which are mechanically sensitive due to their particular configuration, the method according to the present invention produces mechanical stabilization in a simple manner and simultaneously results in electrical measurability under high currents.

A further embodiment which describes the separating process and the etching process following the separating process for the production of a symmetrically blocking thyristor will be described in further detail.

The semiconductor wafer provided with output electrodes as they are shown, for example, in FIG. 3, is attached to a stainless steel plate 20 with an adhesive 19, which, for example may be a cementing lacquer of the type known as "picein" which is a reversible, thermoplastic cement commercially available, for example, from Carl Roth OHG, 75-Karlsruhe-West, West Germany, so that the semiconductor side bearing the gate electrode 10, i.e. the side with the larger electrodes, comes to lie downwardly on the surface of the plate 20. In the subsequent separating process, for example a wet sand blasting process, the wafers are divided into individual chips in about 15 to 45 minutes, the semiconductor chips initially receiving a slope in their edge regions as shown in FIG. 5.

Figure 7:
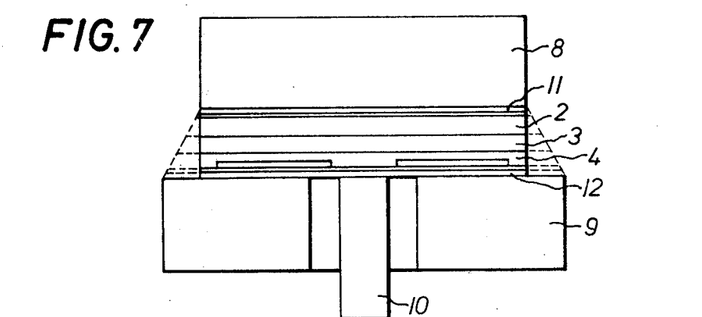
FIGS. 7 and 8 are schematic views illustrating alternative edge contouring steps according to the method of the invention.

The edge regions of the individual semiconductor chips are then partially removed in a further process step, which takes 30 to 180 minutes, by a wet sand blasting method so that the edge of the semiconductor chips will finally be perpendicular to the output electrodes as shown in FIG. 7. Thus an edge angle is produced which is required for symmetrical blocking properties and which has also been found to be favorable for the subsequent etching process. Wet sand blasting is advantageously done with aluminum oxide with a grain size of between 20 and 30$\mu$ which is mixed with approximately the same quantity of water.

If etching of the individual devices is intended to improve the blocking capability, the contacted chips are immersed after the separation, but while still attached to the plate 20, in an etching solution comprising 7 parts per volume of fuming nitric acid (density more than 1.51 g/cm$^3$), 4 parts by volume of a 38 to 40 percent hydrofluoric acid solution and 8 parts by volume of glacial acetic acid, and are etched for 2 to 10 minutes, preferably 5 minutes, at a temperature of about 26° to 30° C while being moved. This produces an edge angle as shown in FIG. 6 which is particularly favorable for high blocking voltages.

Depending on the intended type of surface treatment and subsequent to the sand blasting process or subsequent to this etching, the individual devices are then removed from the carrier plate by dissolving the adhesive by means of suitable solvent, for example, trichloro ethylene, and are thereafter subjected to a new etching process wherein the major surface bearing the cathode and the gate is exposed and the pn-junction is etched. Advisably this second etching is effected with an etching solution comprising 2 parts by volume fuming nitric acid (density more than 1.51 g/cm$^3$), 1 part by volume of a 38 to 40% hydrofluoric acid solution and 1 part by volume glacial acetic acid for a period of from 30 to 90 seconds, preferably 60 seconds, at a temperature of from 18° to 20° C. The process is completed with a final etching in fuming nitric acid (density more than 1.51 g/cm$^3$) for a duration of from 30 to 90 seconds, preferably 60 seconds. With this combined protective etching process, favorable firing conditions and favorable and stable starting conditions for high blocking voltages are produced for the subsequent lacquering process.

Instead of employing an etching process, it is also possible, if required, to produce a particularly favorable edge outline in the semiconductor chips by mechanical means, for example by grinding. This is facilitated because the spacers in the solder 11, 12 maintain a uniform and unchanging thickness of the solder layer and thus precisely fix the position of the semiconductor wafer 1.

Figure 8:
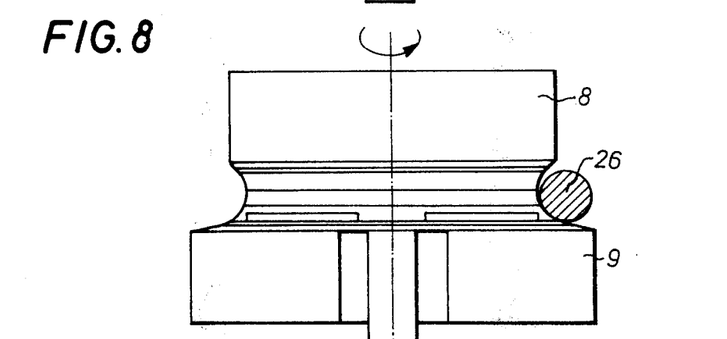

In order to grind the edge outline, the unit cell is rotated about its center axis as shown in FIG. 8 and is guided, while simultaneously adding a grinding agent, against a wire 26 which is tensioned perpendicularly to the center axis. A suitable grinding agent is an aqueous slurry of silicon carbide which contains about 1 liter glycerine and 600 g silicon carbide per 2 liters water. Tungsten or steel are the preferred materials for the wire. By changing the position of the wire 26 or by performing a movement relative to the rotary movement of the unit cell or by changing the diameter of the wire, it is possible to adapt the grinding process to the intended edge contours.

The individual devices, after shaping of their surface by etching or grinding, are finally etched again and are then rinsed in water and acetone and dried for 15 minutes in a dryer at about 200° C. At the end they are provided, as described above, with a passivation layer of lacquer or rubber or glass at their free semiconductor surfaces.

The unit cells can now be stored permanently, they can be transported without special protective measures and can be processed further in mechanized or automatic processing steps. Depending on the requirement, they are finally installed in housings of suitable size or in printed circuits.

It will be understood that the above description of the present invention is susceptible to various modifications, changes and adaptations, and the same are intended to be comprehended within the meaning and range of equivalents of the appended claims.

We claim:

1. A device for simultaneously soldering a plurality of contact electrodes to two sides of a semiconductor wafer comprising in combination:
   first and second centering plates between which a semiconductor wafer is clamped by means of its major surfaces, each of said plates being provided with a plurality of bores which are located at positions corresponding to each of the electrodes to be soldered, each of said bores having a peripheral size and shape corresponding to the respectively associated contact electrode;
   a rod slideably engaged in each of said bores, each of said rods having means, on the end surface thereof which faces the semiconductor wafer, for receiving the associated contact electrode which has been provided with solder; and
   spring means for simultaneously urging said rods toward the semiconductor wafer to press the end surface of the respective contact electrodes against the opposed major surfaces of the semiconductor wafer.

2. A device as defined in claim 1 wherein said first and second centering plates are formed of a metal which is not wetted by the solder to be used and has a coefficient of thermal expansion which does not differ much from that of the semiconductor material of the wafer.

3. A device as defined in claim 2 wherein said first and second centering plates are formed of molybdenum.

4. A device as defined in claim 1 wherein: the wafer contains a plurality of thyristors each of which is to have an annular output electrode and a centrally disposed control electrode attached to one side thereof;

said size and peripheral shape of the associated bore associated with said one side corresponds to that of said output electrode; and said means for receiving on said end surface of the associated one of said rods includes a centrally disposed recess for receiving the control electrode for the thyristor.

5. A device as defined in claim 4 wherein said means for receiving on said end surface of said associated one of said rods further includes an annular recess for receiving the associated output electrode.

* * * * *